United States Patent
Kishi et al.

(10) Patent No.: US 10,412,838 B2
(45) Date of Patent: Sep. 10, 2019

(54) CONDUCTIVE PARTICLE, AND CONNECTION MATERIAL, CONNECTION STRUCTURE, AND CONNECTING METHOD OF CIRCUIT MEMBER

(71) Applicant: Panasonic Intellectual Property Management Co., Ltd., Osaka (JP)

(72) Inventors: Arata Kishi, Fukuoka (JP); Hiroki Maruo, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 211 days.

(21) Appl. No.: 15/582,807

(22) Filed: May 1, 2017

(65) Prior Publication Data

US 2017/0347463 A1 Nov. 30, 2017

(30) Foreign Application Priority Data

May 30, 2016 (JP) ................. 2016-107855

(51) Int. Cl.
| | |
|---|---|
| *B23K 35/26* | (2006.01) |
| *H05K 3/34* | (2006.01) |
| *B23K 1/00* | (2006.01) |
| *C22C 12/00* | (2006.01) |
| *C22C 28/00* | (2006.01) |
| *H01L 23/00* | (2006.01) |
| *H05K 1/11* | (2006.01) |
| *H05K 1/18* | (2006.01) |

(52) U.S. Cl.
CPC ......... *H05K 3/3468* (2013.01); *B23K 1/0016* (2013.01); *B23K 35/264* (2013.01); *C22C 12/00* (2013.01); *C22C 28/00* (2013.01); *H01L 24/13* (2013.01); *H01L 24/16* (2013.01); *H01L 24/81* (2013.01); *H05K 1/111* (2013.01); *H05K 1/181* (2013.01); *H05K 3/3478* (2013.01); *B23K 35/26* (2013.01); *B23K 35/262* (2013.01); *H01L 2224/1329* (2013.01); *H01L 2224/1339* (2013.01); *H01L 2224/13309* (2013.01); *H01L 2224/13311* (2013.01); *H01L 2224/13313* (2013.01); *H01L 2224/13318* (2013.01); *H01L 2224/13339* (2013.01); *H01L 2224/16227* (2013.01); *H01L 2224/81815* (2013.01); *H01L 2924/014* (2013.01); *H01L 2924/20104* (2013.01); *H05K 2201/10234* (2013.01); *H05K 2203/041* (2013.01)

(58) Field of Classification Search
CPC ..... B23K 23/26; B23K 23/263; B23K 23/264
See application file for complete search history.

(56) References Cited

U.S. PATENT DOCUMENTS

| | | | |
|---|---|---|---|
| 9,756,728 B2 * | 9/2017 | Sakai | H05K 3/323 |
| 2015/0008022 A1 | 1/2015 | Masui et al. | |
| 2015/0061129 A1 * | 3/2015 | Hattori | B23K 1/20 257/738 |
| 2017/0281028 A1 * | 10/2017 | Sanpei | A61B 5/0245 |

FOREIGN PATENT DOCUMENTS

| | | |
|---|---|---|
| JP | 2015-155532 A | 8/2015 |
| WO | 2013/125517 A1 | 8/2013 |
| WO | 2014/033983 * | 2/2014 |
| WO | 2016/047408 * | 3/2016 |

OTHER PUBLICATIONS

Wikipedia: "Solder". (Year: 2018).*
Reference.com: "What is Solder Made of?". (Year: 2018).*

* cited by examiner

*Primary Examiner* — Margaret G Moore
(74) *Attorney, Agent, or Firm* — Pearne & Gordon LLP

(57) ABSTRACT

There is provided a conductive particle including a core particle containing a resin material, and a surface layer that covers a surface of the core particle and contains a solder material, in which a melting point of the solder material is equal to or lower than a softening point of the resin material.

6 Claims, 1 Drawing Sheet

CONDUCTIVE PARTICLE, AND CONNECTION MATERIAL, CONNECTION STRUCTURE, AND CONNECTING METHOD OF CIRCUIT MEMBER

BACKGROUND

1. Technical Field

The present disclosure relates to a conductive particle, and a connection material, a connection structure, and a connecting method of a circuit member.

2. Description of the Related Art

In connecting a first circuit member including a first electrode and a second circuit member including a second electrode to each other, an anisotropic conductive adhesive containing a conductive particle is widely used. In a connecting method of the circuit member which uses the anisotropic conductive adhesive, after disposing the first circuit member and the second circuit member such that the first electrode and the second electrode oppose each other via the anisotropic conductive adhesive, the first circuit member and the second circuit member are thermally compressed. The first circuit member and the second circuit member adhere to each other by the anisotropic conductive adhesive, and the first electrode and the second electrode are electrically connected to each other by the conductive particle.

As the conductive particle of the anisotropic conductive adhesive, for example, a resin particle including a nickel-plated layer on a surface thereof is used, and an acrylic resin or the like is used as a material of the resin particle (Japanese Patent Unexamined Publication No. 2015-155532).

SUMMARY

The disclosure relates to a conductive particle which includes a core particle containing a resin material; and a surface layer that covers a surface of the core particle and contains a solder material, in which a melting point of the solder material is equal to or lower than a softening point of the resin material.

The disclosure relates to a connection material of a circuit member which connects a first circuit member having a first main surface provided with a first electrode and a second circuit member having a second main surface provided with a second electrode, to each other, including: an adhesive; and a conductive particle which disperses in the adhesive, in which the conductive particle includes a core particle containing a resin material, and a surface layer that covers a surface of the core particle and contains a solder material, and in which a melting point of the solder material is equal to or lower than a softening point of the resin material.

The disclosure relates to a connection structure of a circuit member, the connection structure including: a first circuit member having a first main surface provided with a first electrode; a second circuit member having a second main surface provided with a second electrode; and a joining portion interposed between the first main surface and the second main surface, in which the joining portion includes a core particle containing a resin material and a solder portion that covers at least a part of the core particle and electrically connects the first electrode and the second electrode to each other, and in which the solder portion contains a solder material having a melting point that is equal to or lower than a softening point of the resin material.

The disclosure relates to a connecting method of a circuit member for connecting a first circuit member having a first main surface provided with a first electrode and a second circuit member having a second main surface provided with a second electrode to each other, the method including: a preparing process of preparing a connection material including an adhesive and a conductive particle which disperses in the adhesive, the conductive particle including a core particle containing a resin material, and a surface layer that covers a surface of the core particle and contains a solder material; a disposing process of disposing the first circuit member and the second circuit member such that the first electrode and the second electrode oppose each other via the connection material; a solder material melting process of melting the solder material by heating the second circuit member while pressing the second circuit member to the first circuit member; and a solder portion forming process of forming a solder portion that electrically connects the first electrode and the second electrode to each other by solidifying the melted solder material, in which a melting point of the solder material is equal to or lower than a softening point of the resin material, in which, in the solder material melting process, at the same time when raising a temperature of the solder material to be equal to or higher than the melting point of the solder material and melting the solder material, or after melting the solder material, a contact area between the first electrode and the second electrode of the melted solder material is widened by raising a temperature of the resin material to be equal to or higher than the softening point of the resin material and by compressing the core particle, and in which, in the solder portion forming process, at the same time when releasing the core particle from a compressed state and lowering a temperature of the resin material to be lower than the softening point of the resin material, or after lowering a temperature of the resin material to be lower than the softening point of the resin material, a temperature of the solder material is lowered to be lower than the melting point of the solder material.

According to the disclosure, it is also possible to increase reliability of electric connection between the first electrode included in the first circuit member and the second electrode included in the second circuit member.

DETAILED DESCRIPTION

Figure 1A:
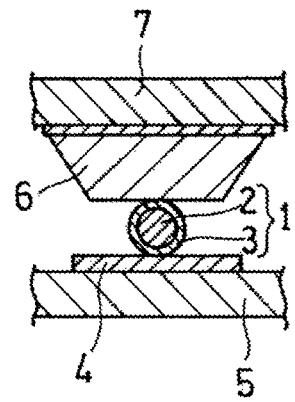
FIG. 1A is a sectional view of main portions illustrating an example of a state of a conductive particle and a state of a formed solder portion in a thermal compressing process, in a connecting method of a circuit member according to an embodiment.

Before the description of the embodiment, problems in the technology of the related art will be briefly described.

When performing the thermal compression, a resin particle softened by heating is deformed by the compression between electrodes by pressing. Accordingly, a contact area between the resin particle (nickel-plated layer) and the electrode increases. After this, when releasing the pressed state, the resin particle is released from the compressed state, and thus, the resin particle is elastically deformed when returning to an original shape. In this manner, by using an elastic force of the resin particle, it is possible to firmly bring a conductive particle into contact with the electrode. However, since the nickel-plated layer follows the elastic deformation of the resin particle, after the pressed state is released, compared to that during the pressing, the contact area between the resin particle (nickel-plated layer) and the electrode decreases, and reliability with respect to the electric connection between the electrodes is not sufficiently obtained.

Hereinafter, a conductive particle, and a connection material, a connection structure, and a connecting method of a circuit member according to the embodiment of the disclosure will be described in detail, but the conductive particle, and the connection material, the connection structure, and the connecting method of a circuit member according to the disclosure are not limited thereto.

The connection structure of a circuit member includes a first circuit member having a first main surface provided with a first electrode; a second circuit member having a second main surface provided with a second electrode; and a joining portion interposed between the first main surface and the second main surface. The joining portion includes a core particle containing a resin material and a solder portion that covers at least a part of the core particle and electrically connects the first electrode and the second electrode to each other. The solder portion contains a solder material having a melting point that is equal to or lower than a softening point of the resin material. The solder portion is formed of the solder material contained in the conductive particle which will be described later.

The softening point of the resin material contained in the core particle generally indicates a Vicat softening temperature measured based on JIS K 7206. However, in a case where the resin material contains a hardened material of a thermosetting resin, a glass transition point of the hardened material becomes a softening point. The glass transition point is measured, for example, by using a differential scanning calorimetry (DSC) based on JIS K 7121.

A forming method of the solder portion, that is, the connecting method of a circuit member includes: (i) a preparing process of preparing a connection material including an adhesive and a conductive particle which disperses in the adhesive; (ii) a disposing process of disposing the first circuit member and the second circuit member such that the first electrode and the second electrode oppose each other via the connection material; (iii) a solder material melting process of melting the solder material by heating the second circuit member while pressing the second circuit member to the first circuit member; and (iv) a solder portion forming process of forming a solder portion that electrically connects the first electrode and the second electrode to each other by solidifying the melted solder material. In the solder portion forming process (iv), the pressed state is also released. In general, at the same time when the pressed state is released, or after releasing the pressed state, the heating is stopped. The solder material melting process (iii) and the solder portion forming process (iv) are a so-called thermal compressing process.

The connection material of the preparing process (i) is a connection material which connects the first circuit member having the first main surface provided with the first electrode and the second circuit member having the second main surface provided with the second electrode to each other, and contains the adhesive and the conductive particle which disperses in the adhesive. The conductive particle contained in the connection material includes a core particle containing a resin material, and a surface layer that covers a surface of the core particle and contains a solder material. The melting point of the solder material contained in the surface layer is equal to or lower than a softening point of the resin material contained in the core particle.

Hereinafter, a procedure in which the solder portion which connects the electrodes to each other by the conductive particle captured between the electrodes is formed in the thermal compressing process, will be described with reference to FIGS. 1A to 1D. In addition, for convenience, in FIGS. 1A to 1D, only the conductive particle contained in the connection material is illustrated, and the adhesive contained in the connection material is not illustrated.

Figure 1B:
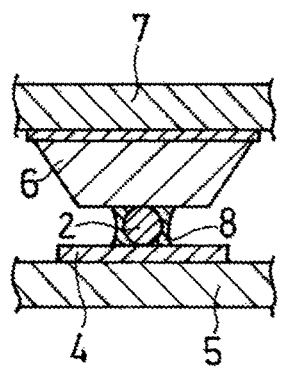
FIG. 1B is a sectional view of main portions illustrating an example of a state of the conductive particle and a state of the formed solder portion in the thermal compressing process, in the connecting method of a circuit member according to the embodiment.
Figure 1C:
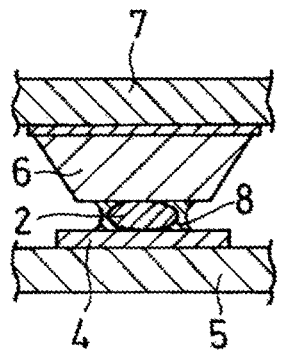
FIG. 1C is a sectional view of main portions illustrating an example of a state of the conductive particle and a state of the formed solder portion in the thermal compressing process, in the connecting method of a circuit member according to the embodiment.
Figure 1D:
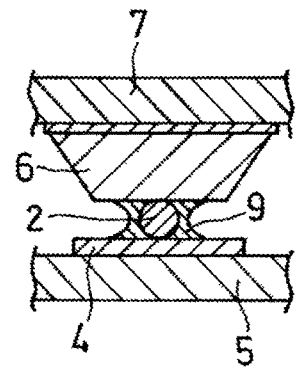
FIG. 1D is a sectional view of main portions illustrating an example of a state of the conductive particle and a state of the formed solder portion in the thermal compressing process, in the connecting method of a circuit member according to the embodiment.

FIG. 1A schematically illustrates a state of the conductive particle captured between the electrodes by the pressing, FIG. 1B schematically illustrates a state of the conductive particle when a temperature of the solder material is raised to be equal to or higher than a melting point of the solder material by the heating, FIG. 1C schematically illustrates a state of the conductive particle when a temperature of the resin material is raised to be equal to or higher than a softening point by the heating, and FIG. 1D schematically illustrates a state where the pressed state is released and the solder portion is formed by solidifying the melted solder, respectively.

By the pressing in the solder material melting process (iii), conductive particle 1 is captured between first electrode 4 included in first circuit member 5 and second electrode (bump) 6 included in second circuit member 7 (FIG. 1A). Conductive particle 1 includes core particle 2 containing a resin material; and surface layer 3 that covers a surface of core particle 2 and contains the solder material. The melting point of the solder material is equal to or lower than the softening point of the resin material.

In the solder material melting process (iii), when the temperature of the solder material is raised to be equal to or higher than the melting point of the solder material by the heating, melted solder material 8 starts to wet the surfaces of first electrode 4 and second electrode 6 (FIG. 1B). At the same time when the solder material is melted, or after the solder material is melted, when the temperature of the resin material is raised to be equal to or higher than the softening point of the resin material by the heating, core particle 2 is softened, and is deformed by being compressed by the pressing (FIG. 1C). At this time, melted solder material 8 follows the deformation of core particle 2, and substantially wet-spreads to the surfaces of first electrode 4 and second electrode 6 (FIG. 1C). In other words, by raising the temperature of the resin material to be equal to or higher than the softening point of the resin material, and by compressing core particle 2, the contact area between first electrode 4 and second electrode 6 of melted solder material 8 widens.

In the solder portion forming process (iv), by releasing the pressed state, when releasing core particle 2 from the compressed state, the shape of core particle 2 returns to the original shape by an elastic force. At the same time when releasing the pressed state, or after releasing the pressed state, the temperature of the resin material is lowered to be lower than the softening point. At the same time when lowering the temperature of the resin material to be lower than the softening point or after lowering the temperature to be lower than the softening point of the resin material, the temperature of the solder material is lowered to be lower than the melting point of the solder material. Accordingly, melted solder material 8 is solidified, and solder portion 9 is formed (FIG. 1D). In this manner, between first circuit member 5 and second circuit member 7, a joining portion including core particle 2 containing the resin material; and solder portion 9 that covers a part other than the part at which first electrode 4 and second electrode 6 of core particle 2 are directly in contact with each other, and electrically connects first electrode 4 and second electrode 6 to each other, is formed.

In other words, the connecting method of a circuit member according to the disclosure for connecting first circuit member 5 having the first main surface provided with first electrode 4, and second circuit member 7 having the second main surface provided with second electrode 6, includes: a preparing process (i) of preparing a connection material including an adhesive and conductive particle 1 which disperses in the adhesive, in which conductive particle 1 includes core particle 2 containing a resin material, and surface layer 3 that covers a surface of core particle 2 and contains a solder material; a disposing process (ii) of disposing first circuit member 5 and second circuit member 7 such that first electrode 4 and second electrode 6 oppose each other via the connection material; a solder material melting process (iii) of melting the solder material by heating the second circuit member while pressing the second circuit member to first circuit member 5; and a solder portion forming process (iv) of forming solder portion 9 that electrically connects first electrode 4 and second electrode 6 to each other by solidifying the melted solder material. The melting point of the solder material is equal to or lower than the softening point of the resin material, and in the solder material melting process (iii), at the same time when raising a temperature of the solder material to be equal to or higher than the melting point of the solder material and melting the solder material, or after melting the solder material, by raising the temperature of the resin material to be equal to or higher than the softening point of the resin material, and by compressing core particle 2, a contact area between first electrode 4 and second electrode 6 of the melted solder material widens. In the solder portion forming process (iv), at the same time when releasing core particle 2 from the compressed state and lowering the temperature of the resin material to be lower than the softening point of the resin material, or after lowering the temperature of the resin material to be lower than the softening point of the resin material, the temperature of the solder material is lowered to be lower than the melting point of the solder material.

When core particle 2 is released from the compressed state and the shape thereof returns to the original shape, solder material 8 is in a melted state, and thus, surface tension acts between first electrode 4 and second electrode 6. Accordingly, melted solder material 8 which exists in the vicinity of the contact surface between first electrode 4 and second electrode 6 rarely follows the elastic deformation by which core particle 2 intends to return to the original shape. Accordingly, a large contact area between the solder material and the electrode obtained when core particle 2 is compressed is nearly maintained (FIG. 1D).

In addition, since solder material 8 is melted, without following the elastic deformation of core particle 2 in the vicinity of the contact surface between first electrode 4 and second electrode 6, a failure that a crack is generated in the solder portion is not generated.

By performing the thermal compressing processing by using the connection material (conductive particle), it is possible to ensure the contact area between the solder portion formed by solidifying the melted solder material and the electrode to be large, and to increase reliability of the electric connection between the electrodes. In other words, it is possible to obtain a connection structure having high reliability of the electric connection between the electrodes. In the thermal compressing process, while at least the core particle is softened (deformed), as the solder material is melted, it is possible to realize the electric connection having high reliability between the electrodes.

Meanwhile, in a case where the melting point of the solder material is higher than the softening point of the resin material even when the resin material is softened by the heating, the solder material in the surface layer is not melted without reaching the melting point. Therefore, when softened core particle 2 is deformed by the pressing, as illustrated in FIG. 1C, the solder material cannot substantially wet-spread to the surfaces of first electrode 4 and second electrode 6. In addition, surface layer 3 cannot follow the deformation of core particle 2, there is a case where a part thereof is cracked and falls off. Accordingly, in a case where the plurality of electrodes are arranged at a predetermined pitch on the main surface of the circuit member, there is a concern that a failure, such as a short circuit between the adjacent electrodes, is generated by a part of the surface layer fallen off.

The softening point of the resin material is preferably equal to or lower than 130° C., is more preferably equal to or lower than 115° C., and is further more preferably equal to or lower than 110° C. Accordingly, it is possible to perform the thermal compressing process at a low temperature (for example, equal to or lower than +10° C. of the softening point of the resin material), and to sufficiently reduce a thermal stress applied to the circuit member. Accordingly, it is possible to obtain a connection structure having higher reliability.

The melting point, of the solder material is preferably equal to or lower than 125° C., is more preferably equal to or lower than 110° C., and is further more preferably equal to or lower than 90° C. Accordingly, it is possible to select a resin material having a low softening point (for example, the softening point is equal to or lower than 130° C.), to perform the thermal compressing process at a low temperature, and to sufficiently reduce the thermal stress applied to the circuit member. Accordingly, it is possible to obtain a connection structure having higher reliability.

A softening point $T_S$ (° C.) of the resin material and a melting point $M_P$ (° C.) of the solder material preferably satisfy a relational expression of $0.62 \leq M_P/T_S \leq 0.96$. When the range is within the above-described range, in the thermal compressing process, even when thermal compression is performed at a relatively low temperature, it becomes easy to increase the contact area between the formed solder portion and the electrode. In addition, it is possible to select the core particle having a low softening point and the solder material having a low melting point, to perform the thermal compressing process at a low temperature, and to sufficiently reduce the thermal stress applied to the circuit member. Accordingly, it is possible to obtain a connection structure having higher reliability.

Resin Adhesion Portion

The joining portion may further include the resin adhesion portion which allows the first main surface and the second main surface to adhere to each other. The resin adhesion portion is formed of the adhesive contained in the connection material. In a case where the adhesive contains the thermosetting resin, the resin adhesion portion contains the hardened material of the thermosetting resin. The connection strength of the circuit member is improved by the resin adhesion portion.

The resin adhesion portion preferably covers at least a part of the solder portion. Accordingly, the solder portion is reinforced, and the strength of the connection structure is further improved. In addition, in a case where the circuit member includes a plurality of electrodes which are arranged at a predetermined pitch, and in a case where the pitch between the electrodes is narrow, insulation between the adjacent electrodes is likely to be ensured. For example, it is desirable that the resin portion is formed to fill voids of the plurality of solder portions that connect the plurality of first electrodes and the plurality of second electrodes to each other.

Connection Material

The connection material includes an adhesive and a conductive particle which disperses in the adhesive. The first main surface and the second main surface adhere to each other by the adhesive, and the first electrode and the second electrode are electrically connected to each other by the conductive particle. The connection material may have a shape of paste or a film shape. In the disposing process (ii), the first main surface or the second main surface may be coated with the paste-like connection material, or the film-like connection material may be disposed.

The amount of the conductive particle contained in the connection material is preferably from 1.0% by volume to 10% by volume. When the amount of the conductive particle is within the above-described range, it is possible to ensure high reliability of the electric connection between the electrodes by the conductive particle. In addition, in a case where the circuit member includes the plurality of electrodes which are arranged at a predetermined pitch, it is possible to reliably perform insulation between the adjacent electrodes by the adhesive.

Conductive Particle

Since the core particle contains a resin material, the core particle has an appropriate elastic force. By using the elastic force, in the thermal compressing process, it is possible to allow the conductive particle and the electrode to firmly adhere to each other.

As the resin material which configures the core particle, a solid resin material is used at a normal temperature, a known material may be used, and an example thereof includes a hardened material of a thermoplastics resin, such as an acrylic resin or a polyolefin resin; or a thermosetting resin, such as an epoxy resin, a phenol resin, or a silicone resin.

The resin material is preferably a hardened material of an epoxy resin or an acrylic resin. The resins have appropriate elastic properties. In addition, since it is possible to set the softening point (or glass transition point) to be equal to lower than 130° C., it is possible to perform the thermal compressing process at a low temperature. In addition, since the resins are appropriately deformed during the pressing, and in accordance with the deformation, it is possible to sufficiently increase the contact area between the melted solder material and the electrode.

The solder material is preferably melted at a low temperature, and preferably contains at least one type selected from the group consisting of tin, silver, bismuth, indium, and zinc. In accordance with the deformation of the core particle during the pressing, the melted solder material can substantially wet-spread on the electrode surface, and the electric connection between the electrodes can be firmly performed.

The solder material more preferably contains a bismuth-indium alloy. A low melting point of the alloy containing bismuth and indium can be performed. Therefore, a heating temperature necessary for connecting the electrodes to each other may be a low temperature. It is possible to reduce a thermal stress applied to the circuit member.

The melting point (mp) of the bismuth-indium alloy contained in the solder material is preferably from 72° C. to 109° C., is more preferably from 85° C. to 109° C., and is particularly preferably from 88° C. to 90° C. By using the bismuth-indium alloy having a low melting point in the solder material, further, by appropriately selecting a resin material having a low softening point, it is possible to perform the connection (thermal compression) between the electrodes, for example, preferably at a low temperature which is equal to or lower than 110° C., and desirably at a low temperature which is equal to or lower than 100° C. Accordingly, it is possible to substantially reduce the thermal stress applied to the circuit member.

Examples of the bismuth-indium alloy of which the melting point is from 72° C. to 109° C. include 35Bi-65In (mp: 72° C.), 51Bi-49In (mp: 85° C.), 55Bi-45In (mp: 89° C.), 27Bi-73In (mp: 100° C.), and 68Bi-32In (mp: 109° C.). However, XBi-YIn means an alloy containing X% by mass of bismuth and Y% by mass of indium.

In the bismuth-indium alloy contained in the solder material, the amount of bismuth contained in the bismuth-indium alloy is preferably from 27% by mass to 68% by mass, and is more preferably from 51% by mass to 55% by mass. Most (99% by mass or more of a remaining part) of the remaining part of the bismuth-indium alloy is preferably indium. The bismuth-indium alloy has high wettability and connection reliability between the electrodes, and a low melting point. Examples of the bismuth-indium alloy also include at least one type selected from the group consisting of $BiIn_2$, $Bi_3In_5$, and BiIn.

In addition, from the viewpoint of improving reliability of electric connection, in the bismuth-indium alloy contained in the solder material, the amount of indium contained in the bismuth-indium alloy is preferably from 32% by mass to 73% by mass, is more preferably from 32% by mass to 49% by mass, and is particularly preferably from 43% by mass to 47% by mass.

An average particle diameter (median diameter (D50) in a volume base) of the core particle is preferably from 2.0 μm to 60 μm. When, the average particle diameter of the core particle is within the above-described range, it is possible to sufficiently ensure high reliability of the electric connection between the electrodes.

As a forming method of the surface layer, a known method may be used, and an example thereof includes a plating method.

The thickness of the surface layer is preferably from 0.05 μm to 3.0 μm. When the thickness of the surface layer is within the above-described range, it is possible to sufficiently ensure high reliability of the electric connection between the electrodes.

In order to sufficiently ensure high reliability of the electric connection between the electrodes, the shape of the conductive particle is preferably a substantially circular shape. An aspect ratio (long diameter/short diameter) of the conductive particle is preferably equal to or less than 2.0, and is more preferably equal to or less than 1.05.

The amount of the solder material contained in the conductive particle is preferably from 1.0% by volume to 10% by volume. When the amount of the solder material is within the above-described range, it is possible to sufficiently ensure high reliability of the electric connection between the electrodes.

Adhesive

The adhesive may be a resin composition containing the thermosetting resin and/or the thermoplastics resin. Among these, the resin, composition containing the thermosetting resin is preferable, and the thermosetting resin preferably contains an epoxy resin. The resin composition may contain a hardener of the thermosetting resin. Examples of the hardener include amine, a phenol resin, and acid anhydride. The resin composition may further contain various additives. Examples of the additive include an active agent which removes an oxide film of the solder material or the electrode surface, a filler, and a hardening accelerator.

In a case where the adhesive contains the thermosetting resin, during the thermal compression, the adhesive can be hardened by proceeding the hardening reaction of the thermosetting resin. At this time, in a case where the hardening reaction of the thermosetting resin insufficiently proceeds, the after-cure may be performed.

The temperature at which the hardening reaction of the thermosetting resin proceeds is preferably higher than the melting point of the solder material. Accordingly, most of the hardening reaction of the thermosetting resin proceeds after the solder material is melted and the first electrode and the second electrode are wet by the solder material. Accordingly, it is possible to improve reliability of the electric connection between the first electrode and the second electrode. The temperature at which the hardening reaction proceeds is acquired, for example, by an endothermic peak temperature measured by a differential scanning calorimetry (DSC).

First Circuit Member

The first circuit member has, for example, the first main surface provided with the plurality of first electrodes which are arranged at a predetermined pitch. The first circuit member is not particularly limited, but for example, may be a transparent board used in a display panel provided in a television, a tablet, a smartphone, and a wearable device. The transparent board may be semitransparent. Examples of the transparent board include a glass board and a film-like board. The film-like board is formed of a transparent resin film. The transparent resin film may be a film, made of, such as polyethylene terephthalate (PET), polycarbonate (PC), or polyethylene naphthalate (PEN).

In a case where the first circuit member is a transparent board, a transparent electrode is used as the first electrode. The transparent electrode may be an oxide containing indium and tin, and may contain an extremely small amount of third metal element in addition to indium and tin. A representative example of the transparent electrode is a so-called indium tin oxide or tin-doped indium oxide (ITO) electrode.

Second Circuit Member

The second circuit member has, for example, the second main surface provided with the plurality of second electrodes which are arranged at a predetermined pitch. The second electrode may include a bump. The second circuit member is not particularly limited, but for example, may be a semiconductor chip, an electronic component package, a film board, and a connector.

The second electrode is not particularly limited, but for example, may be a metal electrode containing gold, platinum, copper, nickel, palladium, or various solders. The solder which forms the metal electrode may include, for example, tin, silver, bismuth, indium, nickel, or copper.

In the disposing process (ii), for example, in a case of using the first circuit member having the first main surface provided with the plurality of first electrodes which are arranged at a predetermined pitch and the second circuit member having the second main surface provided with the plurality of second electrodes which are arranged at a predetermined pitch, the connection material is disposed in a region (hereinafter, first connection region) which covers at least a part of the first electrode of the first main surface of the first circuit member. When the connection material has a shape of paste containing the thermosetting resin in an unhardened state or in a semi-hardened state, the first connection region may be coated with the connection material by using a printing device, a dispenser, or an ink jet nozzle. When the connection material has a shape of a film or a shape of a tape, the film cut out in a predetermined shape from the board may be peeled, and may be compressed to the first connection region. The operation is performed, for example, by a known tape attaching device. In addition, in a region (second connection region) which covers at least, a part of the second electrode of the second main surface of the second circuit member, the connection material may be disposed, and may be disposed in both of the first and second connection regions. In this manner, a laminated structure in which the first circuit member and the second circuit member are disposed to oppose each other via the connection material is obtained.

In the solder material melting process (iii), when pressing the second circuit member to the first circuit member, the first circuit member is also pressed to the second circuit member. In other words, a tool for pressing any of the circuit members may be pressed. The heating of the solder material melting process (iii) is performed by heating the first circuit member and/or the second circuit member, for example, by using the tool for heating. The tool for pressing may also be used as a tool for heating.

During the thermal compression, pressure for pressing the first circuit, member and/or the second circuit member may be from 0.5 MPa to 4 MPa, and is preferably from 1 MPa to 2 MPa. Since the solder material is melted, even when a high pressure is not applied to the circuit member, it is possible to easily perform the electric connection between the electrodes as the electrode becomes wet by the solder material. Since the resin material is softened, even when a high pressure is not applied to the circuit member, it is possible to easily deform the resin material.

The connection structure of the circuit member according to the disclosure is appropriately used in small liquid crystal provided in a tablet or a smartphone.

What is claimed is:

1. A connecting method of a circuit member for connecting a first circuit member having a first main surface provided with a first electrode and a second circuit member having a second main surface provided with a second electrode to each other, the method comprising:
   a preparing process of preparing a connection material including an adhesive and a conductive particle which disperses in the adhesive, the conductive particle including a core particle containing a resin material, and a surface layer that covers a surface of the core particle and contains a solder material;
   a disposing process of disposing the first circuit member and the second circuit member such that the first electrode and the second electrode oppose each other via the connection material;

a solder material melting process of melting the solder material by heating the second circuit member while pressing the second circuit member to the first circuit member; and a solder portion forming process of forming a solder portion that electrically connects the first electrode and the second electrode to each other by solidifying the melted solder material, wherein a melting point of the solder material is equal to or lower than a softening point of the resin material, wherein the solder material melting process includes raising a temperature of the solder material to be equal to or higher than the melting point of the solder material and melting the solder material, and wherein, at the same time as raising the temperature of the solder material, or after melting the solder material, a contact area between the first electrode and the second electrode of the melted solder material is widened by raising a temperature of the resin material to be equal to or higher than the softening point of the resin material, and by compressing the core particle, and wherein the solder portion forming process includes releasing the core particle from a compressed state and lowering a temperature of the resin material to be lower than the softening point of the resin material, and wherein, at the same time as releasing the core particle from a compressed state and lowering a temperature of the resin material, or after lowering a temperature of the resin material to be lower than the softening point of the resin material, a temperature of the solder material is lowered to be lower than the melting point of the solder material.

2. The connecting method of a circuit member of claim 1, wherein a resin adhesion portion that allows the first main surface and the second main surface to adhere to each other is formed of the adhesive.

3. The connecting method of a circuit member of claim 1, wherein the solder material contains at least one type selected from the group consisting of tin, silver, bismuth, indium, and zinc.

4. The connecting method of a circuit member of claim 1, wherein a softening point of the resin material is equal to or lower than 130° C.

5. The connecting method of a circuit member of claim 1, wherein a melting point of the solder material is equal to or lower than 125° C.

6. The connecting method of a circuit member of claim 1, wherein a softening point $T_s$ (° C.) of the resin material and a melting point $M_p$ (° C.) of the solder material satisfy a relational expression of $0.62 \leq M_p/T_s \leq 0.96$.

* * * * *